United States Patent
Choe

(10) Patent No.: US 6,630,846 B2
(45) Date of Patent: Oct. 7, 2003

(54) MODIFIED CHARGE RECYCLING DIFFERENTIAL LOGIC

(75) Inventor: Swee Yew Choe, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/022,258

(22) Filed: Dec. 20, 2001

(65) Prior Publication Data

US 2003/0117178 A1 Jun. 26, 2003

(51) Int. Cl.⁷ .......................................... H03K 19/094
(52) U.S. Cl. ........................ 326/95; 326/98; 326/121; 365/205
(58) Field of Search ...................... 326/93–98; 365/205, 365/207

(56) References Cited

U.S. PATENT DOCUMENTS

| | | | |
|---|---|---|---|
| 4,247,791 A | 1/1981 | Rovell | 307/238 |
| 5,859,548 A | * 1/1999 | Kong | 326/113 |
| 6,028,454 A | 2/2000 | Elmasry et al. | 326/115 |
| 6,211,704 B1 | * 4/2001 | Kong | 326/121 |

OTHER PUBLICATIONS

Choe et al., "Half Rail Differential Logic", ISSCC97/Secession 25/Processors and Logic/Paper SP 25.6 IEEE 0–7803–3721–2/97, 1997, pp. 420 to 421, 336 to 337 and 489.

Won et al., "Modified Half Rail Differential Logic for Reduced Internal Logic Swing", IEEE 0–7803–4455–3/98, 1998, pp. II–157 to II–160.

Kong et al., "Charge Recycling Differential Logic (CRDL) for Low–Power Application", IEEE Journal of Solid–State Circuits, vol. 31, No. 9, Sep. 1996, pp. 1267 to 1276.

Choe et al., "Dynamic Half Rail Differential Logic for Low Power", IEEE 1997, pp. 1936 to 1939.

Jung et al., "Modular Charge Recycling Pass Transistor Logic (MCRPL)", Electronics Letters, vol. 36 No. 5, Mar. 2, 2000, pp. 404 to 405.

Kong et al., "Charge Recycling Differential Logic for Low--Power Application", ISSC96 secession 18, IEEE 0–780331962/98, 1998, pp. 302 to 448.

* cited by examiner

Primary Examiner—Michael Tokar
Assistant Examiner—Vibol Tan
(74) Attorney, Agent, or Firm—Gunnison, McKay & Hodgson, L.L.P.; Philip J. McKay

(57) ABSTRACT

Clocked charge recycling differential logic circuits are activated by a delayed clock. According to the invention, when clocked charge recycling differential logic circuits of the invention are cascaded together, a delayed clock is provided for each clocked charge recycling differential logic circuit and each delayed clock is timed to at least the delay of the previous clocked charge recycling differential logic circuit. Consequently, according to the invention, a delay time is introduced to ensure each clocked charge recycling differential logic circuit of the invention is switched or "fired" only after it has received an input from the previous clocked charge recycling differential logic circuit stage. According to the invention, this is achieved without the use of complicated control circuitry.

21 Claims, 5 Drawing Sheets

MODIFIED CHARGE RECYCLING DIFFERENTIAL LOGIC

FIELD OF THE INVENTION

The present invention relates generally to logic circuits and, more particularly, to charge recycling differential logic circuits.

BACKGROUND OF THE INVENTION

With the emergence of an electronics market that stresses portability, compact size, lightweight and the capability for prolonged remote operation, a demand has arisen for low power circuits and systems. This demand has motivated circuit designers to depart from conventional circuit designs and venture into more power and space efficient alternatives. As part of this effort, charge recycling differential logic has emerged as an important design tool for increasing power efficiency.

FIG. 1A shows a prior art charge recycling differential logic circuit 100A and associated prior art control circuit 100B. As seen in FIG. 1A, prior art charge recycling differential logic circuit 100A required six transistors: PFET 105, PFET 107, NFET 109, NFET 115, NFET 117 and NFET 121. Prior art charge recycling differential logic circuit 100A also included differential logic 123 with control variable inputs 151 and 153, pass variable inputs 155 and 157, output 111 and outBar 113. In addition, PFET 105 and PFET 107 of prior art charge recycling differential logic circuit 100A included back biasing inputs 131 and 133 having a voltage Vbb applied.

As discussed below, prior art charge recycling differential logic circuit 100A also required control circuit 100B. Control circuit 100B included three additional transistors: PFET 137; PFET 135; and NFET 139. Prior art control circuit 100B also included an enable out signal (eout) at terminal 143. According to the prior art, the control signal eout, at terminal 143 was supplied to a prior art charge recycling differential logic circuit 100A as control signal ein at terminal 119 as discussed below.

In FIG. 1A, prior art charge recycling differential logic circuit 100A and associated prior art control circuit 100B are shown separately for simplicity and clarity. However, in practice prior art charge recycling differential logic circuit 100A and associated prior art control circuit 100B are combined in a single circuit. FIG. 1B shows one combination of prior art charge recycling differential logic circuit 100A and associated prior art control circuit 100B into the resulting prior art charge recycling differential logic circuit 100C. As shown in FIG. 1B, prior art charge recycling differential logic circuit 100C required nine transistors: PFET 105, PFET 107, NFET 109, NFET 115, NFET 117, NFET 121, PFET 137; PFET 135; and NFET 139. Prior art charge recycling differential logic circuit 100C also included differential logic 123 with control variable inputs 151 and 153, pass variable inputs 155 and 157, output 111 and outBar 113. In addition, PFET 105 and PFET 107 of prior art charge recycling differential logic circuit 100C included back biasing inputs 131 and 133 having a voltage Vbb applied. Prior art charge recycling differential logic circuit 100C also included an enable out signal (eout) at terminal 143. According to the prior art, the control signal eout, at terminal 143 was supplied to a following prior art charge recycling differential logic circuit (not shown) as control signal ein at a corresponding input terminal as discussed below.

As discussed above, prior art charge recycling differential logic circuit 100C required an enable in (ein) signal, coupled to the gate of NFET 121. The control signal ein was supplied by a prior art control circuit, similar to prior art control circuit 100B in FIG. 1A, of the previous stage. When multiple prior art charge recycling differential logic circuits 100C were cascaded together, prior art control circuit 100B and control signal ein was necessitated to ensure that each prior art charge recycling differential logic circuit 100C switched or "fired" only after it had received an input from the previous stage.

As noted above, when multiple prior art charge recycling differential logic circuits 100C were cascaded together, each prior art charge recycling differential logic circuit 100C required prior art control circuit 100B to ensure that each prior art charge recycling differential logic circuit 100C switched or "fired" only after it had received an input from the previous stage. However, prior art control circuit 100B added significant complexity to prior art charge recycling differential logic circuit 100C, requiring at least three additional transistors and several circuit lines. Consequently, prior art charge recycling differential logic circuit 100C required significant additional components and space. This, in turn, meant that prior art charge recycling differential logic circuit 100C required more silicon, a more complex design, more components to potentially fail and more components to produce heat.

In addition, prior art control circuit 100B not only added complexity to prior art charge recycling differential logic circuits 100C, but it also loaded the output nodes 111 and 113 of prior art charge recycling differential logic circuit 100C and drew current from output nodes 111 and 113 of prior art charge recycling differential logic circuit 100C to charge the control signal ein. In addition, in the prior art, if prior art control circuit 100B were made small, the control signal ein was slow, and this slowed down the operation of prior art charge recycling differential logic circuit 100C. Consequently, there was pressure to increase the size of prior art control circuit 100B. However, Increasing the size of prior art control circuit 100B to speed up the control signal ein also increased the loading on the output nodes 111 and 113 of prior art charge recycling differential logic circuit 100C and therefore slowed down the evaluation of logic 123.

What is needed is a method and apparatus for creating charge recycling differential logic that does not require the complex control circuitry of prior art charge recycling differential logic circuits and is therefore simpler, more space efficient and is more reliable than prior art charge recycling differential logic circuits.

SUMMARY OF THE INVENTION

According to the invention, the prior art control circuitry is eliminated. The clocked charge recycling differential logic circuit of the invention is instead activated from a delayed clock. According to the invention, when clocked charge recycling differential logic circuits of the invention are cascaded together, a delayed clock is provided for each clocked charge recycling differential logic circuit of the invention. Each delayed clock is timed to at least the delay of the previous clocked charge recycling differential logic circuit. Consequently, according to the invention, a delay time is introduced to ensure each clocked charge recycling differential logic circuit of the invention is switched or "fired" only after it has received an input from the previous clocked charge recycling differential logic circuit.

According to the invention, clocked charge recycling differential logic circuits do not require the significant additional components used in the prior art. This, in turn, means that the clocked charge recycling differential logic circuits of the invention require less space, are simpler, dissipate less heat and have fewer components to potentially fail. In addition, clocked charge recycling differential logic circuits of the invention eliminate the loading of the output nodes of the charge recycling differential logic circuit since there is no control signal ein, and therefore no prior art control circuits to draw current from the output nodes to charge the control signal ein. Consequently, using the clocked charge recycling differential logic circuits of the invention, speed is increased because there is less loading on the output nodes and the clocked charge recycling differential logic circuit of the invention can start evaluating once a differential voltage develops between the inputs coming from the previous clocked charge recycling differential logic circuit.

In particular, one embodiment of the invention is a cascaded chain of clocked charge recycling differential logic circuits. The chain includes a first clocked charge recycling differential logic circuit. The first clocked charge recycling differential logic circuit includes: a first clocked charge recycling differential logic circuit clock input terminal; at least one first clocked charge recycling differential logic circuit data input terminal; and at least one first clocked charge recycling differential logic circuit data output terminal.

The cascaded chain also includes a second clocked charge recycling differential logic circuit. The second clocked charge recycling differential logic circuit includes: a second clocked charge recycling differential logic circuit clock input terminal; at least one second clocked charge recycling differential logic circuit data input terminal; and at least one second clocked charge recycling differential logic circuit data output terminal.

According to the invention, the at least one first clocked charge recycling differential logic circuit data output terminal is coupled to the at least one second clocked charge recycling differential logic circuit data input terminal to form the chain. According to the invention, a first clock signal is coupled to the first clocked charge recycling differential logic circuit clock input terminal and a second clock signal is coupled to the second clocked charge recycling differential logic circuit clock input terminal. According to the invention, the second clock signal is delayed with respect to the first clock signal by a predetermined delay time.

In one embodiment of the invention, a delay circuit is coupled between the first clocked charge recycling differential logic circuit clock input terminal and the second clocked charge recycling differential logic circuit clock input terminal to provide the predetermined delay time.

One embodiment of the invention is a clocked charge recycling differential logic circuit that includes a clocked charge recycling differential logic circuit out terminal and a clocked charge recycling differential logic circuit outBar terminal.

In one embodiment of the invention, the clocked charge recycling differential logic circuit also includes a first node, the first node is coupled to a first supply voltage.

In one embodiment of the invention, the clocked charge recycling differential logic circuit also includes a first transistor, the first transistor including a first transistor first flow electrode, a first transistor second flow electrode and a first transistor control electrode. The first node is coupled to the first transistor first flow electrode and the first transistor second flow electrode is coupled to the clocked charge recycling differential logic circuit out terminal. The first transistor also includes a back bias input terminal having a back bias voltage thereon.

In one embodiment of the invention, the clocked charge recycling differential logic circuit also includes a second transistor, the second transistor including a second transistor first flow electrode, a second transistor second flow electrode and a second transistor control electrode. The first node is coupled to the second transistor first flow electrode and the second transistor second flow electrode is coupled to the clocked charge recycling differential logic circuit outBar terminal.

In one embodiment of the invention, the clocked charge recycling differential logic circuit also includes a third transistor, the third transistor including a third transistor first flow electrode, a third transistor second flow electrode and a third transistor control electrode. The first transistor control electrode is coupled to the third transistor first flow electrode and the clocked charge recycling differential logic circuit outBar terminal. The second transistor control electrode is coupled to the third transistor second flow electrode and the clocked charge recycling differential logic circuit out terminal. The third transistor control electrode is coupled to the clock signal.

In one embodiment of the invention, the clocked charge recycling differential logic circuit also includes a fourth transistor, the fourth transistor including a fourth transistor first flow electrode, a fourth transistor second flow electrode and a fourth transistor control electrode. The first transistor second flow electrode is coupled to the fourth transistor first flow electrode. The fourth transistor second flow electrode is coupled to a second node. The fourth transistor control electrode is coupled to the third transistor first flow electrode and the clocked charge recycling differential logic circuit outbar terminal.

In one embodiment of the invention, the clocked charge recycling differential logic circuit also includes a fifth transistor, the fifth transistor including a fifth transistor first flow electrode, a fifth transistor second flow electrode and a fifth transistor control electrode. The second transistor second flow electrode is coupled to the fifth transistor first flow electrode. The fifth transistor second flow electrode is coupled to the second node. The fifth transistor control electrode is coupled to the third transistor second flow electrode and the clocked charge recycling differential logic circuit out terminal.

In one embodiment of the invention, the clocked charge recycling differential logic circuit also includes a sixth transistor, the sixth transistor including a sixth transistor first flow electrode, a sixth transistor second flow electrode and a sixth transistor control electrode. The sixth transistor first flow electrode is coupled to the second node and the sixth transistor second flow electrode is coupled to a second supply voltage. A delayed clock signal is coupled to the sixth transistor control electrode of the clocked charge recycling differential logic circuit.

In one embodiment of the invention, the clocked charge recycling differential logic circuit also includes a logic block, the logic block including at least one logic block control variable input terminal, a logic block out terminal and a logic block outBar terminal. The logic block out terminal is coupled to the clocked charge recycling differential logic circuit out terminal and the logic block outBar terminal is coupled to the clocked charge recycling differential logic circuit outBar terminal.

As discussed in more detail below, the method and apparatus of the invention for creating charge recycling differential logic does not require the complex control circuitry of prior art charge recycling differential logic circuits and is therefore simpler, saves space and is more reliable than prior art charge recycling differential logic circuits. As a result, the clocked charge recycling differential logic circuits of the invention are better suited to the present electronics market that stresses portability, compact size, lightweight and the capability for prolonged remote operation.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

Figure 1A:
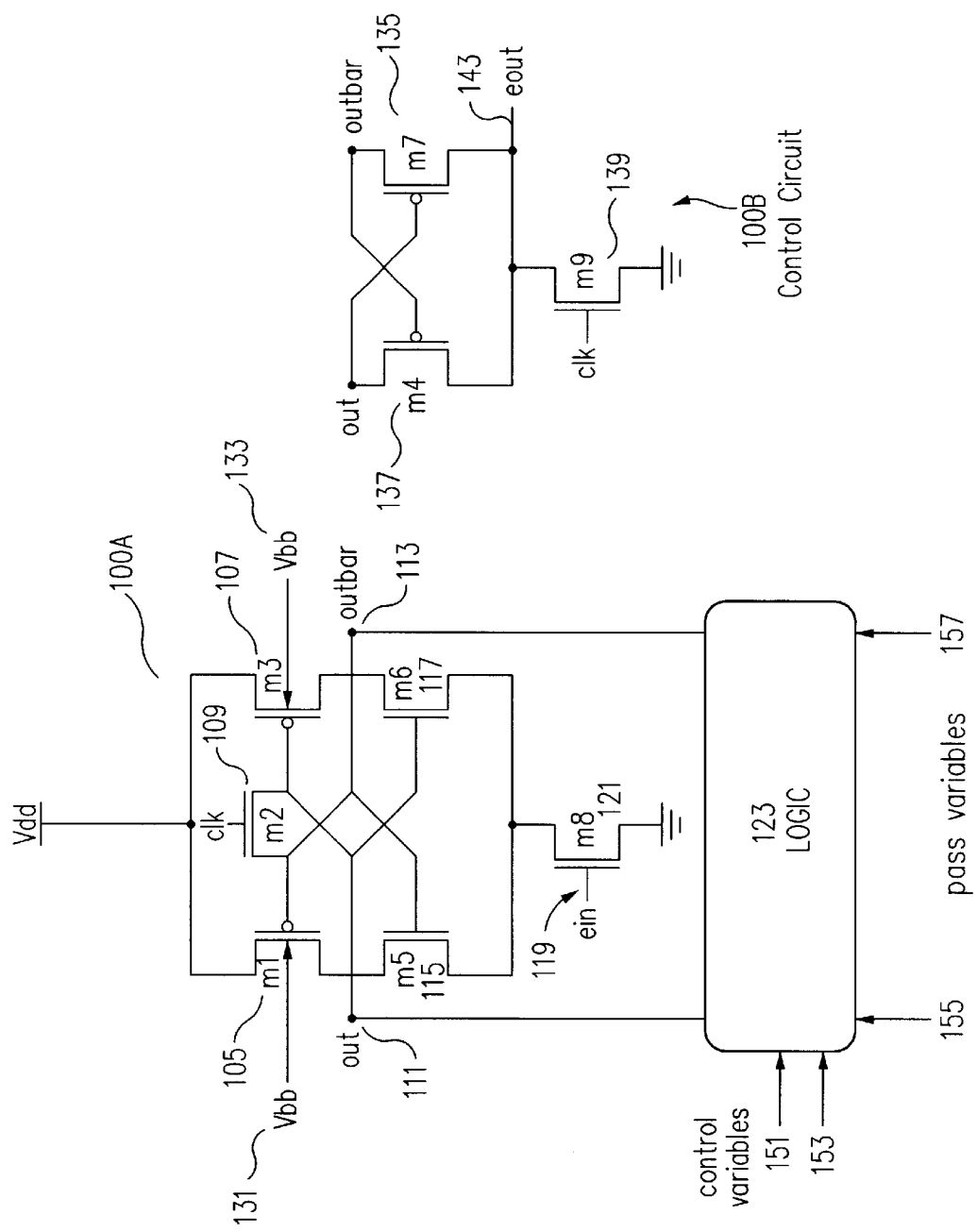
FIG. 1A shows a schematic diagram of a prior art charge recycling differential logic circuit and associated prior art control circuit.
Figure 2:
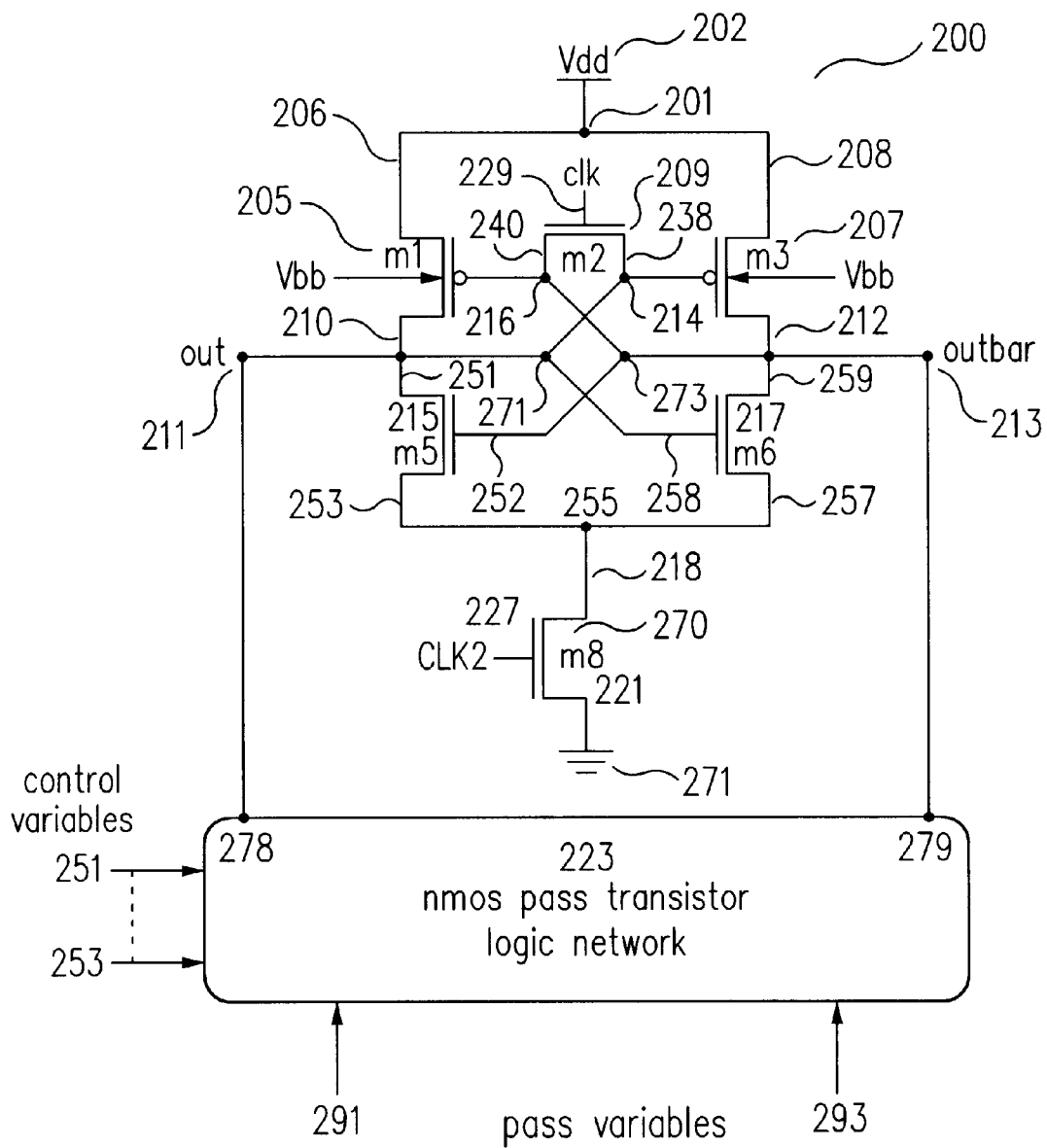
FIG. 2 shows a schematic diagram of one embodiment of a clocked charge recycling differential logic circuit designed according to the principles of the present invention.

According to the invention, the prior art control circuitry (100B in FIG. 1A) is eliminated and the clocked charge recycling differential logic circuits (200 in FIG. 2, 300A, 300B, 300C and 300N in FIG. 3) of the invention are activated instead from a delayed clock signal (CLKi 227 in FIG. 2; CLKA 361, CLKB 371, CLKC 381 and CLKN 391 in FIG. 3; and CLKA 461, CLKB 471, CLKC 481 and CLKD 490 in FIG. 4).

Figure 3:
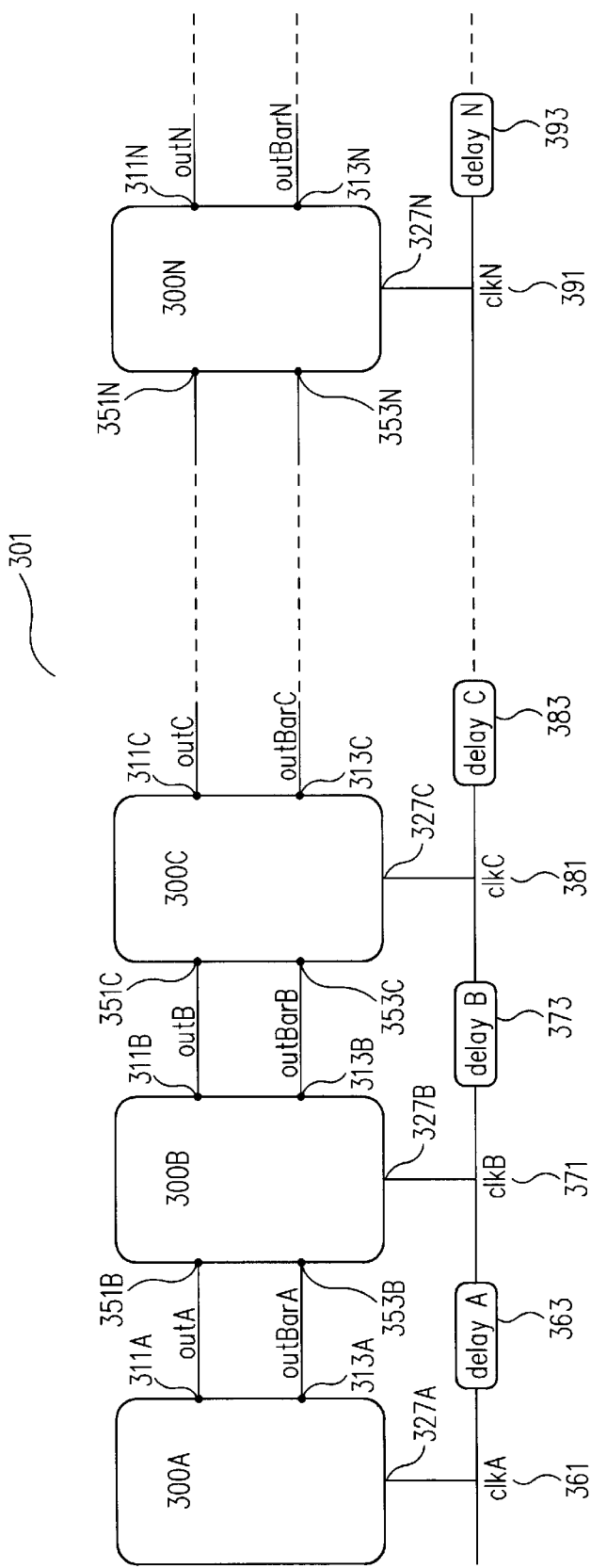
FIG. 3 shows one embodiment of a cascaded chain of clocked charge recycling differential logic circuits according to the principles of the present invention.

According to the invention, when clocked charge recycling differential logic circuits of the invention are cascaded together in a chain (301 in FIG. 3), a delayed clock signal is provided for each clocked charge recycling differential logic circuit of the invention (300A, 300B, 300C and 300N in FIG. 3). The delayed clock signals are, according to the invention, timed to at least the delay of the previous clocked charge recycling differential logic circuit. Consequently, according to the invention, a delay circuit (363, 373, 383 in FIG. 3) introduces a delay time (463, 473, and 483 in FIG. 4) between each clocked charge recycling differential logic circuit of the invention to introduce a delay time and ensure each clocked charge recycling differential logic circuit of the invention is switched or "fired" only after it has received an input from the previous clocked charge recycling differential logic circuit.

Figure 1B:
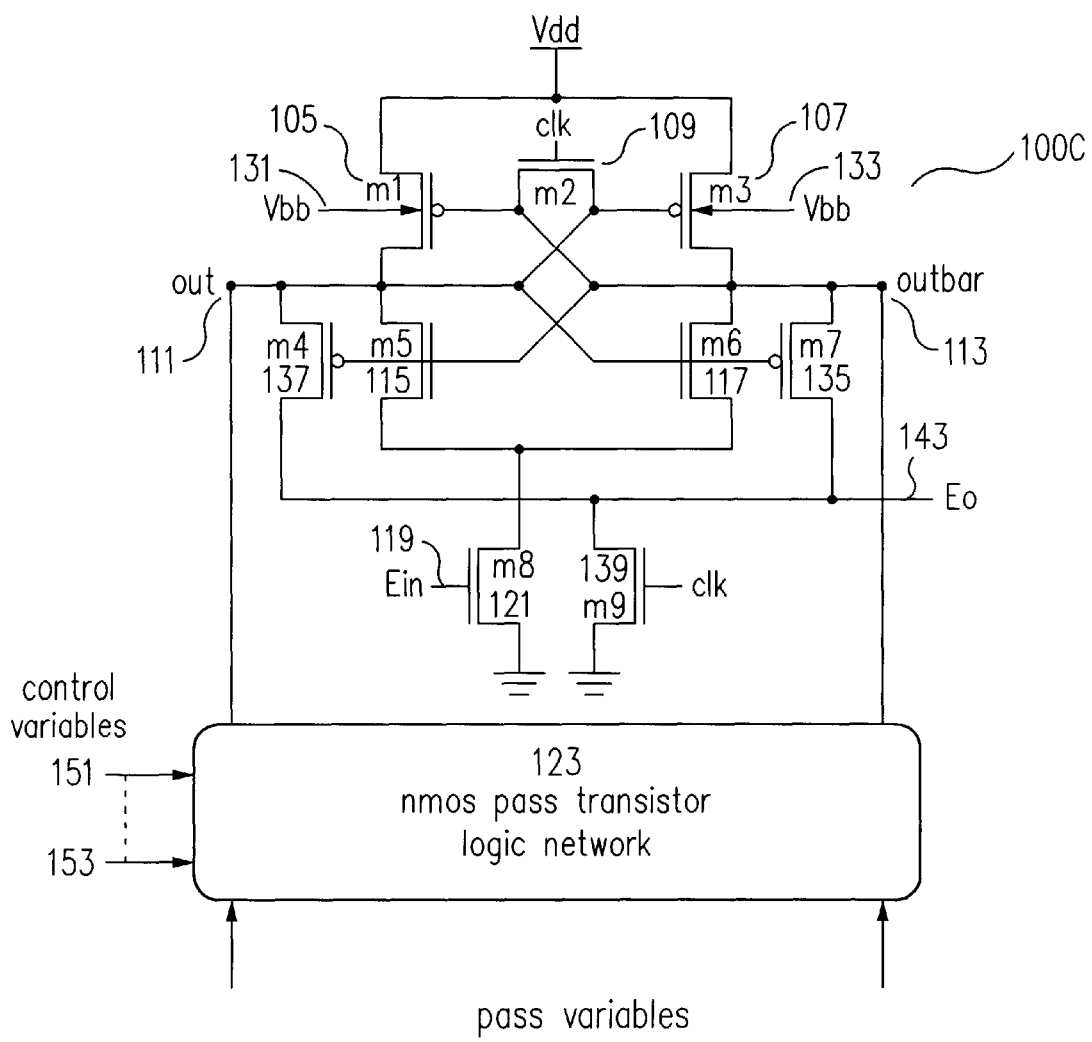
FIG. 1B shows one combination of prior art charge recycling differential logic circuit and associated prior art control circuit into a resulting prior art charge recycling differential logic circuit.

According to the invention, clocked charge recycling differential logic circuits do not require the significant additional components required in the prior art (control circuit 100B in FIG. 1A). This, in turn, means that clocked charge recycling differential logic circuits of the invention require less space, are simpler and have fewer components to potentially fail. In addition, clocked charge recycling differential logic circuits of the invention also eliminate the loading of the output nodes (211 and 213 in FIG. 2, 311A, 313A, 311B, 313B, 311C, 313C, 311N and 313N in FIG. 3) of the charge recycling differential logic circuit since there are no control signals (ein in FIG. 1A and FIG. 1B) and no prior art control circuits (100B in FIG. 1A) to draw current from the output nodes to charge the control signals. Consequently, using the clocked charge recycling differential logic circuits of the invention, speed is increased because there is less loading on the output nodes and the clocked charge recycling differential logic circuits of the invention can start evaluating as soon as a differential voltage develops between the inputs coming from the previous clocked charge recycling differential logic circuit.

As a result, the clocked charge recycling differential logic circuits of the invention are better suited to the present electronics market that stresses portability, compact size, lightweight and the capability for prolonged remote operation.

FIG. 2 shows a schematic diagram of one embodiment of a clocked charge recycling differential logic circuit 200 designed according to the principles of the present invention. As seen in FIG. 2, clocked charge recycling differential logic circuit 200 includes a first supply voltage 202 coupled to a first node 201. First node 201 is coupled to both a source 206, of a first transistor, PFET 205 and a source 208, of a second transistor, PFET 207. The signal CLK is coupled to a control electrode or gate 229 of a third transistor, NFET 209. A control electrode or gate 216 of PFET 205 is coupled to a source 240 of NFET 209 and an outBar terminal 213. A control electrode or gate 214 of PFET 207 is coupled to a drain 238 of NFET 209 and an out terminal 211. A drain 210 of PFET 205 is coupled to out terminal 211 and a drain 212, of PFET 207 is coupled to outBar terminal 213.

Clocked charge recycling differential logic circuit 200 also includes a fourth transistor, NFET 215 including a drain 251, a source 253 and a control electrode or gate 252. Drain 210 of PFET 205 is coupled to drain 251 of NFET 215. Source 253 of NFET 215 is coupled to a second node 255. Gate 252 of NFET 215 is coupled to source 240 of NFET 209 and the clocked charge recycling differential logic circuit outBar terminal 213.

Clocked charge recycling differential logic circuit 200 also includes a fifth transistor, NFET 217 including a drain 259, a source 257 and a control electrode or gate 258. Drain 212 of PFET 207 is coupled to drain 259 of NFET 217. Source 257 of NFET 217 is coupled to a second node 255. Gate 258 of NFET 217 is coupled to drain 238 of NFET 209 and out terminal 211.

In one embodiment of the invention, clocked charge recycling differential logic circuit 200 also includes a sixth transistor, NFET 270, including a drain 218, a source 221 and a control electrode or gate 227. Drain 218 of NFET 270 is coupled to second node 255. Source 221 of NFET 270 is coupled to a second supply voltage 271. A delayed clock signal CLKi is coupled to control electrode or gate 227 of NFET 270.

In one embodiment of the invention, the clocked charge recycling differential logic circuit also includes a logic block 223. In one embodiment of the invention, logic block 223 is an NMOS pass transistor logic network including control variable input terminals 251 and 253 and pass variable input terminals 291 and 293. A logic block out terminal 278 is coupled to out terminal 211 and a logic block outBar terminal 279 is coupled to outBar terminal 213. In other embodiments of the invention, logic block 223 includes any type of differential logic and/or circuitry used in the art including various logic gates, logic devices and circuits.

A particular embodiment of a clocked charge recycling differential logic circuit 200 according to the invention is shown in FIG. 2. Those of skill in the art will recognize that clocked charge recycling differential logic circuit 200 can be easily modified. For example, different transistors, i.e., PFETs 205 and 207 or NFETs 209, 215, 217 and 270 can be used. In particular, the NFETs and PFETS shown in FIG. 2 can be readily exchanged for PFETs and NFETs by reversing the polarities of the supply voltages 202 and 271, or by other well known circuit modifications. Consequently, the clocked charge recycling differential logic circuit 200 that is shown in FIG. 2 is simply one embodiment of the invention used for illustrative purposes only and does not limit the present invention to that one embodiment of the invention.

As discussed above, the method and apparatus of the invention for creating clocked charge recycling differential logic circuits 200 does not require the complex control circuit 100B (FIG. 1A) of prior art charge recycling differential logic circuits 100C (FIG. 1B) and is therefore simpler, saves space and is more reliable than prior art charge recycling differential logic circuits 100C. As a result, the clocked charge recycling differential logic circuits 200 (FIG. 2) of the invention are better suited to the present electronics market that stresses portability, compact size, lightweight and the capability for prolonged remote operation. However, as also discussed above, according to the invention, when clocked charge recycling differential logic circuits 200 of the invention are cascaded together in a chain, a delayed clock signal must be provided for each clocked charge recycling differential logic circuit 200 of the invention. The delayed clock signals are, according to the invention, timed to be at least the delay of the previous clocked charge recycling differential logic circuit 200 to ensure each clocked charge recycling differential logic circuit 200 of the invention is switched or "fired" only after it has received an input from the previous clocked charge recycling differential logic circuit 200.

FIG. 3 shows one embodiment of a cascaded chain 301 of clocked charge recycling differential logic circuits 300A, 300B, 300C and 300N of the present invention. Each clocked charge recycling differential logic circuit 300A, 300B, 300C and 300N represents a stage in cascaded chain 301. In one embodiment of the invention, each clocked charge recycling differential logic circuit 300A, 300B, 300C and 300N is similar to clocked charge recycling differential logic circuit 200 discussed above with respect to FIG. 2.

As seen in FIG. 3, clocked charge recycling differential logic circuit 300A includes: a clock input terminal 327A; an out terminal 311A; and an outBar terminal 313A. Clocked charge recycling differential logic circuit 300B includes: a clock input terminal 327B; an input terminal 351B, coupled to out terminal 311A of clocked charge recycling differential logic circuit 300A; an inputBar terminal 353B, coupled to outBar terminal 313A of clocked charge recycling differential logic circuit 300A; an output terminal 311B; and an outBar terminal 313B. Likewise, clocked charge recycling differential logic circuit 300C includes: a clock input terminal 327C; an input terminal 351C, coupled to output terminal 311B of clocked charge recycling differential logic circuit 300B; an inputBar terminal 353C, coupled to outBar terminal 313B of clocked charge recycling differential logic circuit 300B; an output terminal 311C; and an outBar terminal 313C. Clocked charge recycling differential logic circuit 300N includes: a clock input terminal 327N; an input terminal 351N, coupled to an output terminal 311N−1 (not shown) of a clocked charge recycling differential logic circuit 300N−1 (not shown); an inputBar terminal 353N, coupled to an outBar terminal 313N−1 (not shown) of a clocked charge recycling differential logic circuit 300N−1 (not shown); an output terminal 311N; and an outBar terminal 313N.

According to the invention, any number of clocked charge recycling differential logic circuits 300A, 300B, 300C and 300N can be employed with cascaded chain 301. As also shown in FIG. 3, and discussed above, output terminal 311A of clocked charge recycling differential logic circuit 300A couples signal OUTA to input terminal 351B of clocked charge recycling differential logic circuit 300B and outBar terminal 313A of clocked charge recycling differential logic circuit 300A couples signal OUTBARA to inputBar terminal 353B of clocked charge recycling differential logic circuit 300B. Likewise, output terminal 311B of clocked charge recycling differential logic circuit 300B couples signal OUTB to input terminal 351C of clocked charge recycling differential logic circuit 300C and outBar terminal 313B of clocked charge recycling differential logic circuit 300B couples signal OUTBARB to inputBar terminal 353C of clocked charge recycling differential logic circuit 300C. In addition, output terminal 311N of clocked charge recycling differential logic circuit 300N couples signal OUTN to an input terminal 351N+1 (not shown) of a clocked charge recycling differential logic circuit 300N+1 (not shown) and outBar terminal 313N of clocked charge recycling differential logic circuit 300N couples signal OUTBARN to an inputBar terminal 353N+1 (not shown) of a clocked charge recycling differential logic circuit 300N+1 (not shown).

In addition to the structure discussed above, according to the invention, each clocked charge recycling differential logic circuit 300A, 300B, 300C and 300N of cascaded chain 301 receives its own delayed clock signal CLKA 361, CLKB 371, CLKC 381 and CLKN 391, respectively. According to the invention clock signals CLKA 361, CLKB 371, CLKC 381 and CLKN 391 are provided to clocked charge recycling differential logic circuits 300A, 300B, 300C and 300N, respectively, by introducing delay circuits 363, 373, 383 and 393 between successive clocked charge recycling differential logic circuits 300A, 300B, 300C and 300N. Consequently, delay circuit 363 introduces a delay time between signal CLKA 361, coupled to clock input terminal 327A of clocked charge recycling differential logic circuit 300A, and signal CLKB 371, coupled to clock input terminal 327B of clocked charge recycling differential logic circuit 300B. Delay circuit 373 introduces a delay time between signal CLKB 371 and signal CLKC 381, coupled to clock input terminal 327C of clocked charge recycling differential logic circuit 300C. Two delay circuits 363 and 373 introduce two delay times between signal CLKA 361 and signal CLKC 381. Likewise, a series of N−1 delay circuits, and N−1 delay times, exists between signal CLKA 361 and signal CLKN 391, coupled to clock input terminal 327N of clocked charge recycling differential logic circuit 300N, and a further delay circuit 393 introduces a further delay time between CLKN 391 and CLK N+1 (not shown) coupled to a clock input terminal 327N+1 (not shown) of a clocked charge recycling differential logic circuit 300N+1 (not shown).

Delay circuits 363, 373, 383 and 393 are any one of many delay circuits known in the art such as inverters, or groups of inverters, gates, transistors or any other elements that introduce a time delay. According to the invention, delay circuits 363, 373, 383 and 393 are used to ensure the activation of each stage, i.e., each clocked charge recycling differential logic circuit 300A, 300B, 300C and 300N, is timed such that the delay of the clock is longer than the evaluation duration of the previous stage. In one embodiment of the invention, the delayed clock signals CLKA 361, CLKB 371, CLKC 381 and CLKN 391 are timed to switch high (active) when the differential input voltage to clocked charge recycling differential logic circuit 300A, 300B, 300C and 300N reaches a predetermined voltage level. The clock delay can be adjusted according to the predetermined differential voltage level required for robustness and the specific needs of the circuit designer. This differential voltage level is typically a function of process and will vary from circuit to circuit and system to system. Importantly, however, using the method and structure of the invention, there is no need for the control signals ein or control circuit 100B (FIG. 1A).

Figure 4:
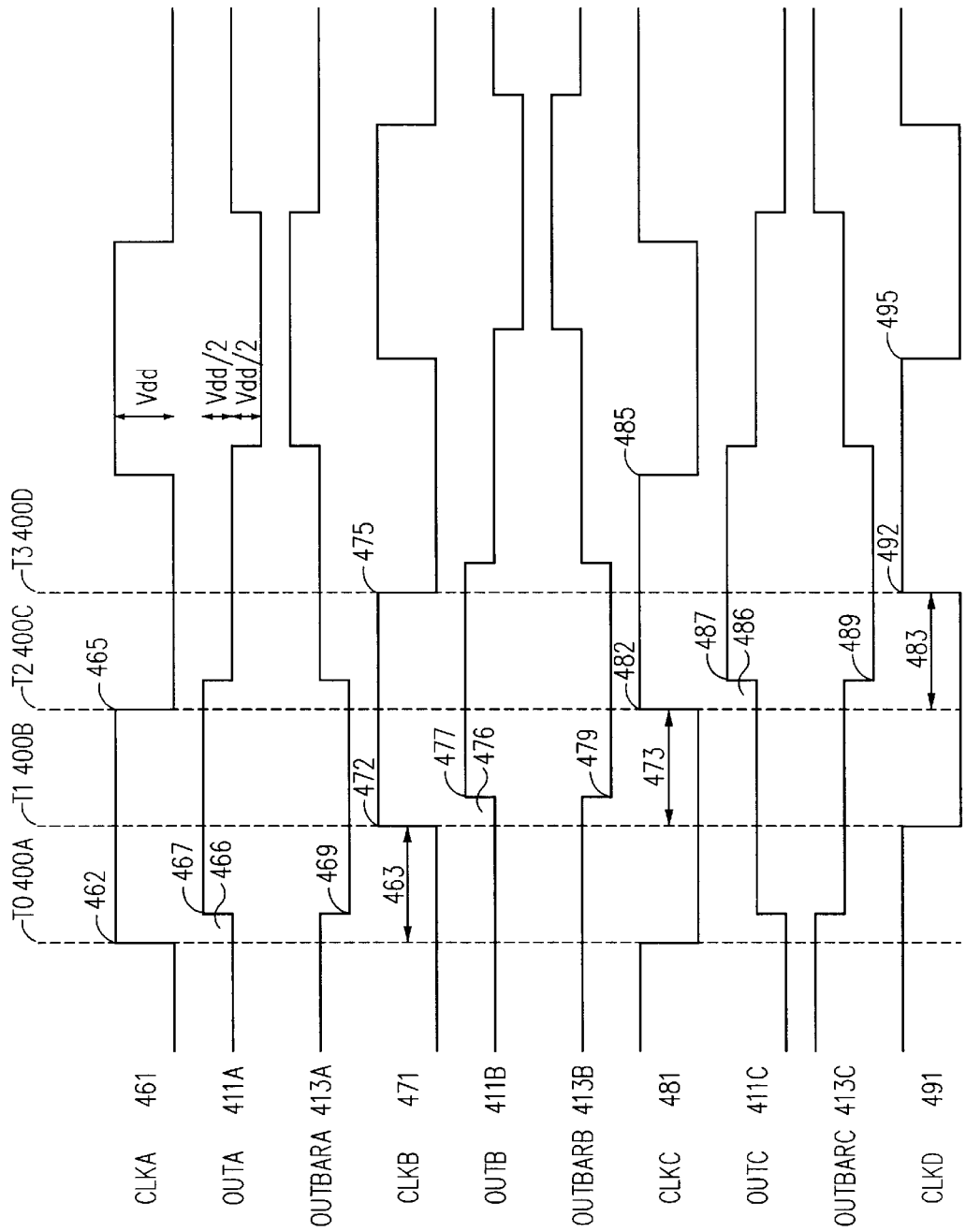
FIG. 4 is a one embodiment of a timing diagram for the cascaded chain of clocked charge recycling differential logic circuits of the invention shown in FIG. 3.

FIG. 4 is one embodiment of a timing diagram for cascaded chain 301 of clocked charge recycling differential logic circuits 300A, 300B, 300C and 300N of FIG. 3. As seen in FIG. 3 and FIG. 4 together, according to one embodiment of the invention, at time T0, i.e., point 400A in FIG. 4, signal CLKA 461 goes high. After a short switching delay 466, such as the short switching delay inherent in any circuit, signal OUTA 411A at out terminal 311A switches high and signal OUTBARA at outBar terminal 313A switches low at points 467 and 469, respectively. A delay time 463 from point T0 400A and to point T1 400B is introduced by delay circuit 363. As discussed above, delay time 463 helps ensure clocked charge recycling differential logic circuit 300B receives signals OUTA and OUTBARA from clocked charge recycling differential logic circuit 300A before the switching of signal CLKB 471.

At point 472 in FIG. 4, i.e., at point T1 400B, signal CLKB 471 switches high. After a short switching delay 476, signal OUTB 411B at out terminal 311B switches high and signal OUTBARB at outBar terminal 313B switches low at points 477 and 479, respectively. A delay time 473 from point T1 400B to point T2 400C is introduced by delay circuit 373. As discussed above, delay time 473 helps ensure clocked charge recycling differential logic circuit 300C receives signals OUTB and OUTBARB from clocked charge recycling differential logic circuit 300B before the switching of signal CLKC 481.

At point 482 in FIG. 4, i.e., at point T2 400C, signal CLKC 481 switches high. After a short switching delay 486, signal OUTC 411C at out terminal 311C switches high and signal OUTBARC at outBar terminal 313C switches low at points 487 and 489, respectively. A delay time 483 from point T2 400C to point T3 400D is introduced by delay circuit 383. As discussed above, delay time 483 helps ensure the following clocked charge recycling differential logic circuit (not shown) receives signals OUTC and OUTBARC from clocked charge recycling differential logic circuit 300C before the switching of signal CLKD 491.

At point 492 in FIG. 4, i.e., at point T3 400D, signal CLKD 491 switches high. As discussed above, according to the invention, any number of clocked charge recycling differential logic circuits 300A, 300B, 300C and 300N can be employed with cascaded chain 301. In addition, the process discussed above will repeat for each switching of the system clock. Those of skill in the art will further recognize that the choice of signal highs and signal lows was made arbitrarily in FIG. 4 for illustrative purposes only and that at other times, and in other embodiments of the invention, signal highs could be replaced with signal lows and vice-versa.

As shown above, according to the invention, the prior art control circuitry is eliminated and the clocked charge recycling differential logic circuits of the invention are activated instead from a delayed clock signal. According to the invention, when clocked charge recycling differential logic circuits of the invention are cascaded together in a chain, a delayed clock signal is provided for each clocked charge recycling differential logic circuit of the invention. The delayed clock signals are, according to the invention, timed to be at least the delay of the previous clocked charge recycling differential logic circuit. Consequently, according to the invention, a delay time is introduced to ensure each clocked charge recycling differential logic circuit of the invention is switched or "fired" only after it has received an input from the previous clocked charge recycling differential logic circuit stage.

According to the invention, clocked charge recycling differential logic circuits do not require the significant additional components needed in the prior art. This, in turn, means that clocked charge recycling differential logic circuits of the invention require less space, are simpler to implement and employ and have fewer components to potentially fail and produce heat. In addition, clocked charge recycling differential logic circuits of the invention also eliminate the loading of the output nodes of the charge recycling differential logic circuit since there are no control signals, and no prior art control circuits, to draw current from the output nodes to charge the control signals. Consequently, using the clocked charge recycling differential logic circuits of the invention, speed is increased because there is less loading on the output nodes and the clocked charge recycling differential logic circuits of the invention can start evaluating as soon as a differential voltage develops between the complementary inputs coming from the previous clocked charge recycling differential logic circuit.

As a result, the clocked charge recycling differential logic circuits of the invention are better suited to the present electronics market that stresses portability, compact size, lightweight and the capability for prolonged remote operation.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

For example, for illustrative purposes specific embodiments of the invention were shown with specific transistors. However, the NFETs and PFETS shown in the figures can be readily exchanged for PFETs and NFETs by reversing the polarities of the supply voltages or by other well known circuit modifications.

Consequently, the scope of the invention is defined by the claims and their equivalents.

What is claimed is:

1. A synchronous cascaded chain of clocked charge recycling differential logic circuits comprising:
   a first clocked charge recycling differential logic circuit, said first clocked charge recycling differential logic circuit comprising:
   a first clocked charge recycling differential logic circuit clock input terminal;

at least one first clocked charge recycling differential logic circuit data input terminal; and at least one first clocked charge recycling differential logic circuit data output terminal;

a second clocked charge recycling differential logic circuit, said second clocked charge recycling differential logic circuit comprising:

a second clocked charge recycling differential logic circuit clock input terminal;

at least one second clocked charge recycling differential logic circuit data input terminal; and at least one second clocked charge recycling differential logic circuit data output terminal;

a first clock signal coupled to said first clocked charge recycling differential logic circuit clock input terminal;

a second clock signal coupled to said second clocked charge recycling differential logic circuit clock input terminal, wherein;

said at least one first clocked charge recycling differential logic circuit data output terminal is coupled to said at least one second clocked charge recycling differential logic circuit data input terminal, further wherein;

said second clock signal is said first clock signal delayed by a predetermined fixed delay time such that said second clocked charge recycling differential logic circuit is switched only after it has received an input from said first clocked charge recycling differential logic circuit.

2. The cascaded chain of clocked charge recycling differential logic circuits of claim 1, further comprising:

a delay circuit coupled between said first clocked charge recycling differential logic circuit clock input terminal and said second clocked charge recycling differential logic circuit clock input terminal for delaying said second clock signal with respect to said first clock signal by said predetermined delay time.

3. The cascaded chain of clocked charge recycling differential logic circuits of claim 2, wherein;

said delay circuit comprises at least one inverter.

4. The cascaded chain of clocked charge recycling differential logic circuits of claim 2, wherein;

said delay circuit comprises at least two inverters.

5. A synchronous cascaded chain of clocked charge recycling differential logic circuits comprising:

a first supply voltage;

a second supply voltage;

a first clocked charge recycling differential logic circuit, said first clocked charge recycling differential logic circuit comprising:

a first clocked charge recycling differential logic circuit out terminal;

a first clocked charge recycling differential logic circuit outBar terminal;

a first clocked charge recycling differential logic circuit first node, said first clocked charge recycling differential logic circuit first node being coupled to said first supply voltage;

a first transistor, said first transistor comprising a first transistor first flow electrode, a first transistor second flow electrode and a first transistor control electrode, said first clocked charge recycling differential logic circuit first node being coupled to said first transistor first flow electrode, said first transistor second flow electrode being coupled to said first clocked charge recycling differential logic circuit out terminal;

a second transistor, said second transistor comprising a second transistor first flow electrode, a second transistor second flow electrode and a second transistor control electrode, said first clocked charge recycling differential logic circuit first node being coupled to said second transistor first flow electrode, said second transistor second flow electrode being coupled to said first clocked charge recycling differential logic circuit outBar terminal;

a third transistor, said third transistor comprising a third transistor first flow electrode, a third transistor second flow electrode and a third transistor control electrode, said first transistor control electrode being coupled to said third transistor first flow electrode and said first clocked charge recycling differential logic circuit outBar terminal, said second transistor control electrode being coupled to said third transistor second flow electrode and said first clocked charge recycling differential logic circuit out terminal;

a fourth transistor, said fourth transistor comprising a fourth transistor first flow electrode, a fourth transistor second flow electrode and a fourth transistor control electrode, said first transistor second flow electrode being coupled to said fourth transistor first flow electrode, said fourth transistor second flow electrode being coupled to a first clocked charge recycling differential logic circuit second node, said fourth transistor control electrode being coupled to said third transistor first flow electrode and said first clocked charge recycling differential logic circuit outBar terminal;

a fifth transistor, said fifth transistor comprising a fifth transistor first flow electrode, a fifth transistor second flow electrode and a fifth transistor control electrode, said second transistor second flow electrode being coupled to said fifth transistor first flow electrode, said fifth transistor second flow electrode being coupled to said first clocked charge recycling differential logic circuit second node, said fifth transistor control electrode being coupled to said third transistor second flow electrode and said first clocked charge recycling differential logic circuit out terminal;

a sixth transistor, said sixth transistor comprising a sixth transistor first flow electrode, a sixth transistor second flow electrode and a sixth transistor control electrode, said sixth transistor first flow electrode being coupled to said first clocked charge recycling differential logic circuit second node, said sixth transistor second flow electrode being coupled to said second supply voltage; and a logic block, said logic block comprising: at least one logic block input terminal; a logic block out terminal; and a logic block outBar terminal, said logic block out terminal being coupled to said first clocked charge recycling differential logic circuit out terminal and said logic block outBar terminal being coupled to said first clocked charge recycling differential logic circuit outBar terminal;

a first clock signal, said first clock signal being coupled to said sixth transistor control electrode of said first clocked charge recycling differential logic circuit;

a second clocked charge recycling differential logic circuit, said second clocked charge recycling differential logic circuit comprising:

a second clocked charge recycling differential logic circuit out terminal;

a second clocked charge recycling differential logic circuit outBar terminal;

a second clocked charge recycling differential logic circuit first node, said second clocked charge recycling differential logic circuit first node being coupled to said first supply voltage;

a first transistor, said first transistor comprising a first transistor first flow electrode, a first transistor second flow electrode and a first transistor control electrode, said second clocked charge recycling differential logic circuit first node being coupled to said first transistor first flow electrode, said first transistor second flow electrode being coupled to said second clocked charge recycling differential logic circuit out terminal;

a second transistor, said second transistor comprising a second transistor first flow electrode, a second transistor second flow electrode and a second transistor control electrode, said second clocked charge recycling differential logic circuit first node being coupled to said second transistor first flow electrode, said second transistor second flow electrode being coupled to said second clocked charge recycling differential logic circuit out terminal;

a third transistor, said third transistor comprising a third transistor first flow electrode, a third transistor second flow electrode and a third transistor control electrode, said first transistor control electrode being coupled to said third transistor first flow electrode and said second clocked charge recycling differential logic circuit outBar terminal, said second transistor control electrode being coupled to said third transistor second flow electrode and said second clocked charge recycling differential logic circuit out terminal;

a fourth transistor, said fourth transistor comprising a fourth transistor first flow electrode, a fourth transistor second flow electrode and a fourth transistor control electrode, said first transistor second flow electrode coupled to said fourth transistor first flow electrode, said fourth transistor second flow electrode being coupled to a second clocked charge recycling differential logic circuit second node, said fourth transistor control electrode being coupled to said third transistor first flow electrode and said second clocked charge recycling differential logic circuit outBar terminal;

a fifth transistor, said fifth transistor comprising a fifth transistor first flow electrode, a fifth transistor second flow electrode and a fifth transistor control electrode, said second transistor second flow electrode being coupled to said fifth transistor first flow electrode, said fifth transistor second flow electrode being coupled to said second clocked charge recycling differential logic circuit second node, said fifth transistor control electrode being coupled to said third transistor second flow electrode and said second clocked charge recycling differential logic circuit out terminal;

a sixth transistor, said sixth transistor comprising a sixth transistor first flow electrode, a sixth transistor second flow electrode and a sixth transistor control electrode, said sixth transistor first flow electrode being coupled to said second clocked charge recycling differential logic circuit second node, said sixth transistor second flow electrode being coupled to said second supply voltage; and a logic block, said logic block comprising: at least one logic block input terminal; a logic block out terminal; and a logic block outBar terminal, said logic block out terminal being coupled to said second clocked charge recycling differential logic circuit out terminal and said logic block outBar terminal being coupled to said second clocked charge recycling differential logic circuit outBar terminal;

a second clock signal, said second clock signal being coupled to said sixth transistor control electrode of said second clocked charge recycling differential logic circuit, wherein;

said second clock signal is said first clock signal delayed by a predetermined fixed delay time such that said second clocked charge recycling differential logic circuit is switched only after it has received an input from said first clocked charge recycling differential logic circuit.

6. The cascaded chain of clocked charge recycling differential logic circuits of claim 5, further comprising:

a delay circuit, said delay circuit being coupled between said sixth transistor control electrode of said sixth transistor of said first clocked charge recycling differential logic circuit and said sixth transistor control electrode of said sixth transistor of said second clocked charge recycling differential logic circuit;

said delay circuit thereby providing said predetermined delay time.

7. The cascaded chain of clocked charge recycling differential logic circuits of claim 6, wherein;

said delay circuit comprises at least one inverter.

8. The cascaded chain of clocked charge recycling differential logic circuits of claim 6, wherein;

said delay circuit comprises at least two inverters.

9. The cascaded chain of clocked charge recycling differential logic circuits of claim 5, wherein;

said logic block of said first clocked charge recycling differential logic circuit and said logic block of said second clocked charge recycling differential logic circuit comprise differential logic.

10. The cascaded chain of clocked charge recycling differential logic circuits of claim 5, wherein;

said logic block of said first clocked charge recycling differential logic circuit and said logic block of said second clocked charge recycling differential logic circuit comprise differential logic gates.

11. The cascaded chain of clocked charge recycling differential logic circuits of claim 5, wherein;

said logic block of said first clocked charge recycling differential logic circuit and said logic block of said second clocked charge recycling differential logic circuit comprise NMOS pass transistor logic;

said logic block of said first clocked charge recycling differential logic circuit comprises at least one control variable input and at least one pass variable input; and said logic block of said second clocked charge recycling differential logic circuit comprises at least one control variable input and at least one pass variable input.

12. The cascaded chain of clocked charge recycling differential logic circuits of claim 5, wherein;

said first supply voltage is Vdd and said second supply voltage is ground.

13. The cascaded chain of clocked charge recycling differential logic circuits of claim 12, wherein;

said first transistor and said second transistor of said first clocked charge recycling differential logic circuit and said first transistor and said second transistor of said second clocked charge recycling differential logic circuit are PFETs.

14. The cascaded chain of clocked charge recycling differential logic circuits of claim 13, wherein;

said third transistor, said fourth transistor, said fifth transistor and said sixth transistor of said first clocked charge recycling differential logic circuit and said third transistor, said fourth transistor, said fifth transistor and said sixth transistor of said second clocked charge recycling differential logic circuit are NFETs.

15. A synchronous clocked charge recycling differential logic circuit comprising:

a first supply voltage;

a second supply voltage;

a clocked charge recycling differential logic circuit out terminal;

a clocked charge recycling differential logic circuit outBar terminal;

a clocked charge recycling differential logic circuit first node, said clocked charge recycling differential logic circuit first node being coupled to said first supply voltage;

a first transistor, said first transistor comprising a first transistor first flow electrode, a first transistor second flow electrode and a first transistor control electrode, said clocked charge recycling differential logic circuit first node being coupled to said first transistor first flow electrode, said first transistor second flow electrode being coupled to said clocked charge recycling differential logic circuit out terminal;

a second transistor, said second transistor comprising a second transistor first flow electrode, a second transistor second flow electrode and a second transistor control electrode, said clocked charge recycling differential logic circuit first node being coupled to said second transistor first flow electrode, said second transistor second flow electrode being coupled to said clocked charge recycling differential logic circuit outBar terminal;

a third transistor, said third transistor comprising a third transistor first flow electrode, a third transistor second flow electrode and a third transistor control electrode, said first transistor control electrode being coupled to said third transistor first flow electrode and said clocked charge recycling differential logic circuit outBar terminal, said second transistor control electrode being coupled to said third transistor second flow electrode and said clocked charge recycling differential logic circuit out terminal;

a clocked charge recycling differential logic circuit second node;

a fourth transistor, said fourth transistor comprising a fourth transistor first flow electrode, a fourth transistor second flow electrode and a fourth transistor control electrode, said first transistor second flow electrode being coupled to said fourth transistor first flow electrode, said fourth transistor second flow electrode being coupled to said clocked charge recycling differential logic circuit second node, said fourth transistor control electrode being coupled to said third transistor first flow electrode and said clocked charge recycling differential logic circuit outBar terminal;

a fifth transistor, said fifth transistor comprising a fifth transistor first flow electrode, a fifth transistor second flow electrode and a fifth transistor control electrode, said second transistor second flow electrode being coupled to said fifth transistor first flow electrode, said fifth transistor second flow electrode being coupled to said clocked charge recycling differential logic circuit second node, said fifth transistor control electrode being coupled to said third transistor second flow electrode and said clocked charge recycling differential logic circuit out terminal;

a sixth transistor, said sixth transistor comprising a sixth transistor first flow electrode, a sixth transistor second flow electrode and a sixth transistor control electrode, said sixth transistor first flow electrode being coupled to said clocked charge recycling differential logic circuit second node, said sixth transistor second flow electrode being coupled to said second supply voltage;

a logic block, said logic block comprising at least one logic block input terminal, a logic block out terminal, and a logic block outbar terminal, said logic block out terminal being coupled to said clocked charge recycling differential logic circuit out terminal, said logic block outBar terminal being coupled to said first clocked charge recycling differential logic circuit outBar terminal;

a clock signal, said clock signal being coupled to said third transistor control electrode;

a delayed clock signal, said delayed clock signal being coupled to said sixth transistor control electrode of said clocked charge recycling differential logic circuit, thereby delaying the switching of said clocked charge recycling differential logic circuit by a predetermined fixed delay time, wherein;

said delayed clock signal is said clock signal delayed by said predetermined fixed delay time such that said clocked charge recycling differential logic circuit is switched only after it has received an input from a previous clocked charge recycling differential logic circuit.

16. The clocked charge recycling differential logic circuit of claim 15, wherein;

said logic block of said clocked charge recycling differential logic circuit comprises differential logic.

17. The clocked charge recycling differential logic circuit of claim 15, wherein;

said logic block of said clocked charge recycling differential logic circuit comprises differential logic gates.

18. The clocked charge recycling differential logic circuit of claim 15, wherein;

said logic block of said clocked charge recycling differential logic circuit comprises NMOS pass transistor logic; and said logic block of said clocked charge recycling differential logic circuit includes at least one control variable input and at least one pass variable input.

19. The clocked charge recycling differential logic circuit of claim 15, wherein;

said first supply voltage is Vdd and said second supply voltage is ground.

20. The clocked charge recycling differential logic circuit of claim 19, wherein;

said first transistor and said second transistor are PFETs.

21. The clocked charge recycling differential logic circuit of claim 20, wherein;

said third transistor, said fourth transistor, said fifth transistor and said sixth transistor are NFETs.

* * * * *